United States Patent [19]
Boulaev

[11] Patent Number: 5,958,133
[45] Date of Patent: Sep. 28, 1999

[54] MATERIAL HANDLING SYSTEM FOR GROWING HIGH-PURITY CRYSTALS

[75] Inventor: Anatoli S. Boulaev, Pittsford, N.Y.

[73] Assignee: General Signal Corporation, Stamford, Conn.

[21] Appl. No.: 08/592,895

[22] Filed: Jan. 29, 1996

[51] Int. Cl.⁶ .................................................. C30B 35/00
[52] U.S. Cl. .......................... 117/208; 117/214; 117/216
[58] Field of Search .................................... 117/200, 208, 117/214, 216

[56] References Cited

U.S. PATENT DOCUMENTS

| | | |
|---|---|---|
| 2,893,847 | 7/1959 | Schweickert et al. . |
| 3,261,722 | 7/1966 | Keller et al. . |
| 3,360,405 | 12/1967 | Keller . |
| 3,494,804 | 2/1970 | Hanks et al. . |
| 3,498,847 | 3/1970 | Keller . |
| 3,582,287 | 6/1971 | Capita . |
| 4,350,560 | 9/1982 | Helgeland et al. . |
| 4,659,421 | 4/1987 | Jewett . |
| 4,661,324 | 4/1987 | Sink et al. . |
| 4,973,454 | 11/1990 | Morioka et al. . |
| 5,009,864 | 4/1991 | Ibe et al. . |

OTHER PUBLICATIONS

"A unique Concept Takes Shape", article on Chemitronic's new crystal–pulling facility in Burghausen, 5 pages.

*Primary Examiner*—Felisa Hiteshew
*Attorney, Agent, or Firm*—Eugene Stephens & Associates

[57] ABSTRACT

A crystal-growing machine (10) includes a furnace chamber (12) and two loading chambers (14 and 16) that permit simultaneous processing operations. At least one of the two loading chambers (14 and 16) includes a lifting mechanism (36) for pulling a crystal (40) from a melt (20) in the furnace chamber (12). A positioning mechanism (60) disengages one of the loading chambers (14 and 16) from the furnace chamber (12) for cooling the crystal (40) in an evacuated environment and engages the other of the loading chambers (14 and 16) for simultaneously recharging the melt (20) or starting growth of another crystal.

38 Claims, 7 Drawing Sheets

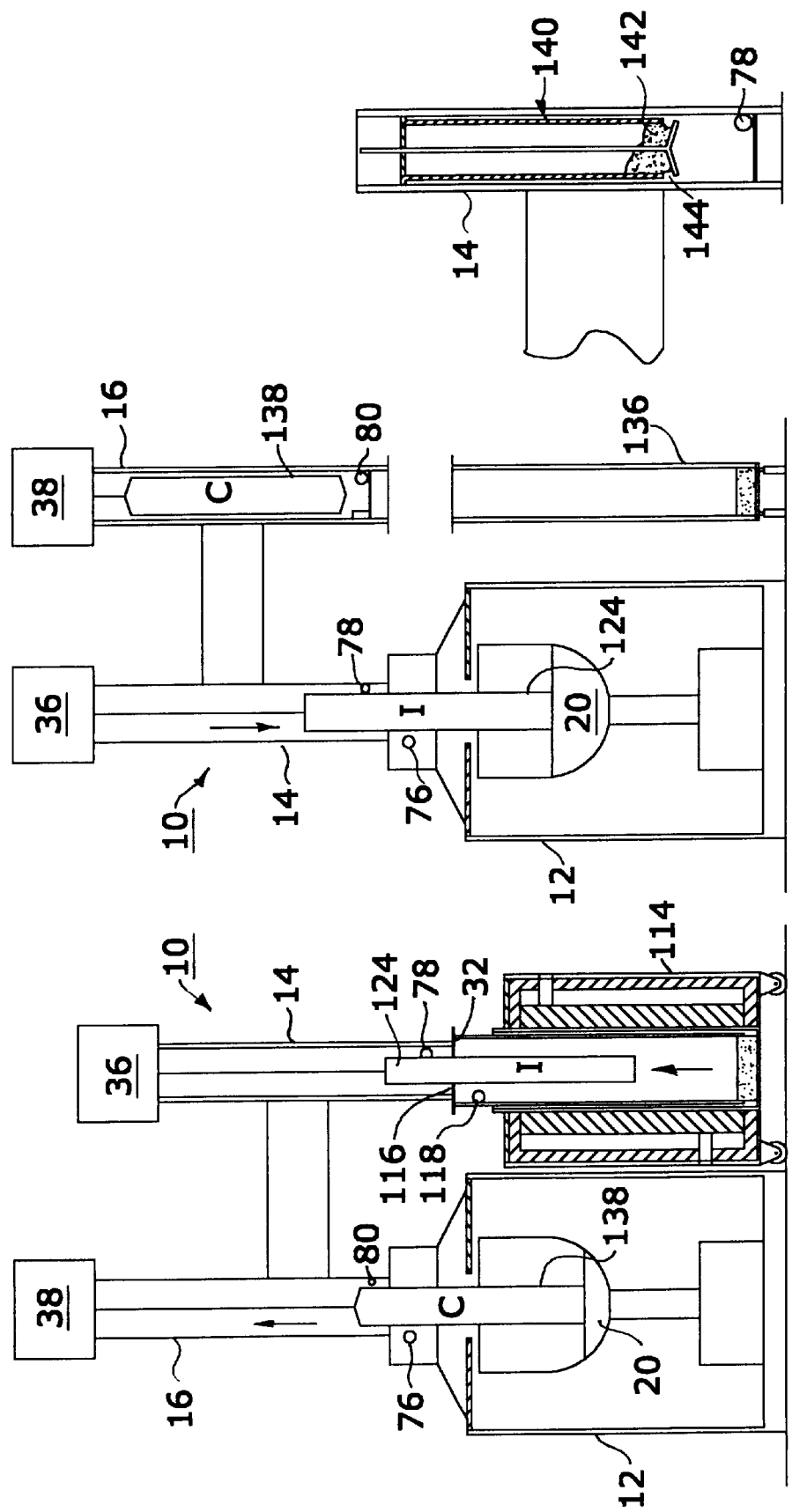

MATERIAL HANDLING SYSTEM FOR GROWING HIGH-PURITY CRYSTALS

TECHNICAL FIELD

The invention relates to the manufacture of high-purity monocrystals and in particular to the handling of materials in support of crystal-growing operations.

BACKGROUND

High-purity monocrystals of such materials as silicon or germanium are grown in vacuum furnaces according to the Czochralski pulling technique by withdrawing a solidified crystal from a melt under precisely controlled conditions. The growing process is very slow, lasting several hours, during which the growing crystal is gradually lifted into a loading chamber. For example, the finished crystals, which can measure one meter or more in length, are typically grown at rates averaging between three and six centimeters per hour.

After completion of the growing process, the finished crystal remains within an evacuated environment of the loading chamber for several additional hours (e.g., six to nine hours) to cool. The furnace is ordinarily shut down during the cooling cycle (cooldown) to conserve power. After completion of the cooling cycle, the finished crystal is removed through a door in the loading chamber, and the furnace is cleaned and readied for another charge.

The loading chamber together with the top of the furnace is removed for cleaning the furnace interior (i.e., tank). This includes removing and replacing a crucible for containing the melt. Ten to fifteen percent of the original charge of crystal-forming material remains in the crucible; and its solidification during the cooling cycle causes the crucible, which is generally made of quartz, to break. Both the crucible and the scrap crystal-forming material are costly to replace.

After a new crucible is installed and filled with chunks of crystal-forming material (i.e., a new charge), the top of the furnace is replaced. In the meantime, a seed crystal is suspended within the loading chamber. The refitted furnace and loading chamber are evacuated (pumpdown), and the furnace is powered for melting the charge. The melting cycle (meltdown), which also lasts several hours, is continued until desired thermal conditions have been achieved in the melt for growing another crystal. The actual growing cycle is begun by dipping the seed crystal into the melt and slowly withdrawing the seed crystal from the melt. The melt crystallizes at the seed, and the new crystal grows to dimensions controlled by a rate of pulling the crystal from the melt.

Nearly one-half of the total processing time is spent on operations other than actual crystal growth. These operations include: cooling (cooldown), cleaning, reloading, evacuating (pumpdown), and melting (meltdown). The consequently large amount of processing time required for each crystal limits the productivity of crystal-forming machines, which are themselves expensive to purchase and maintain.

So-called "continuous" crystal-growing processes shorten the meltdown cycle by using a smaller initial charge and adding crystal-forming material during the crystal-growing process. However, special apparatus required to continuously supply charge to the melt adds more expense than can be saved from the shortened meltdown cycle. Nevertheless, "continuous" processes are used for achieving special crystal quality requirements, such as reduced oxygen content.

"Recharging" crystal-growing processes reuse the crystal and residual melt one or more times by continuously operating the furnace. After the cooled crystal is removed, a recharging device is installed in the loading chamber for gradually adding crystal-forming material to the melt until a full charge is reached. Then, the recharging device is replaced by a suspended seed crystal for starting the crystal growth.

While such "recharging" processes extend crucible life and reduce scrap of crystal-forming material, the savings is offset by the additional cost of operating the furnace throughout the cooling cycle of the crystal. Also, crucibles deteriorate with exposure to such high temperatures and add contamination to the melt. For example, heated quartz crucibles slowly dissolve in the presence of a silicon charge releasing silicon monoxide into the melt. The continuous dissolution of crucibles during such "recharging" processes diminishes crystal quality and limits the number of times the crucibles can be reused.

Crystal-growing machines are installed in clean rooms to limit contamination of high-purity crystals from air-borne particles, especially metal particles. The contaminants enter the crystal-forming material from brief exposure to ambient air while the machines are opened for cleaning and reloading. Market demands for larger diameter crystals (e.g., 200 mm–300 mm) increase problems with maintaining clean room environments. Larger machines require more space, which is more difficult to keep clean; and heavier duty lifting systems generate more contamination.

SUMMARY OF INVENTION

My invention in its various embodiments provides for reducing overall processing time for making crystals, lowering material costs, and improving crystal quality. Time is saved by conducting some of the processing operations simultaneously and by better preparation of materials. Material costs are lowered by reducing scrap and by substituting lower cost materials. Crystal quality is improved in several ways including reducing exposure of materials to contaminants and providing more stable growing cycles.

My improved crystal-growing machine can be constructed with the usual features of a vacuum furnace chamber for melting crystal-forming material and a vacuum loading chamber for pulling a crystal from the melt. However, in place of a single vacuum loading chamber, first and second vacuum loading chambers are provided with respective openings that are alternately engageable with an opening in the vacuum furnace chamber for maintaining a common vacuum pressure between the furnace chamber and either of the first and second vacuum loading chambers. A positioning mechanism moves the first and second vacuum loading chambers between a first position at which the opening in the first vacuum loading chamber is engaged with the opening in the furnace chamber and a second position at which the opening in the second vacuum loading chamber is engaged with the opening in the furnace chamber.

Each of the openings in the two loading chambers and the furnace chamber can be closed by respective shutoff valves for preserving separate vacuum pressures in the chambers. Preferably, the shutoff valves are flapper valves and the flapper valves of the two loading chambers are related to the flapper valve of the furnace chamber so that their respective flappers move between open and closed positions through a common space between the engaged chambers.

The additional loading chamber can be used for different purposes depending on the method employed for growing the crystals. In a "recharging" process, the first loading chamber can be used to lift a first crystal from the furnace chamber while the second loading chamber is loaded with a replacement charge for forming a second crystal. After the first crystal is fully grown, the shutoff valves of the first loading chamber and furnace are closed and the first loading chamber is moved out of engagement with the furnace chamber. The shutoff valve of the first loading chamber remains closed until the first crystal has cooled enough to permit exposure to ambient air. While the first crystal is cooling, the second loading chamber is moved into engagement with the furnace chamber and the replacement charge is heated in preparation for making the second crystal.

The fully cooled first crystal is removed from the first loading chamber and is replaced by a seed crystal for starting growth of the second crystal. Following the recharging operation, the second loading chamber is disengaged from the furnace chamber and the first loading chamber is re-engaged. The growth cycle of the second crystal begins by dipping the seed crystal into the recharged melt and pulling the second crystal into the first loading chamber.

Productivity is increased by deferring cleaning operations and by performing the meltdown operation with the second loading chamber at the same time that the cooldown operation is performed in the first loading chamber. The furnace is operated continuously for meltdown and crystal growth, thereby allowing reuse of residual melt and furnace components such as crucibles containing the melt. No additional power is required to operate the furnace continuously and the furnace components are expected to last longer than those of conventional "recharging" processes, because the cooling cycle of the crystal is performed simultaneously with the required heating operations.

According to this "recharging" method for growing crystals, the first and second loading chambers can be specialized for performing their separate operations. For example, only the first loading chamber requires a lifting and rotating mechanism for pulling crystals from the melt. The second loading chamber can include special apparatus for adding crystal-forming material to the melt.

A vacuum transport chamber can be used in conjunction with the second loading chamber for eliminating exposure of the crystal-forming material to ambient air in the vicinity of the new crystal-growing machine. The transport chamber can be loaded with the crystal-forming material within a separate clean room having a higher standard of air quality than the larger clean room containing the crystal-forming machines. After sealing the load, the transport chamber can be moved into the larger clean room for transferring its contents to the second loading chamber. For example, a similar valved opening in the transport chamber can be engaged with the opening in the second loading chamber for transferring the load within a common vacuum environment that is isolated from the air in the larger clean room.

A preheating vacuum chamber can also be used in conjunction with the second loading chamber for preheating the crystal-forming material. The preheating step shortens the meltdown time of the second charge and permits the use of less expensive ingots that would otherwise tend to break from exposure to extreme thermal gradients during meltdown. For example, ingots of $SiHCl_3$ material can be preheated to approximately 1000° Centigrade in the preheating vacuum chamber before being transferred within a continuous vacuum environment through the second loading chamber to the furnace chamber. The $SiHCl_3$ material melts at approximately 1450° C., so the thermal gradient is limited to only 450° C.

My invention also includes special benefits for so-called "continuous" processes in which additional apparatus is used to add a steady supply of crystal-forming material during the crystal-growing cycle. Ordinarily, "continuous" processes maintain a stable amount of melt until the crystal is near completion, and then the level is allowed to drop to lessen the amount of waste. However, according to my invention, a stable level can be maintained throughout the entire length of crystal growth for improving crystal consistency.

Immediately after removing a first crystal in the first loading chamber, the second loading chamber can be engaged with the furnace chamber with a seed crystal in place for starting growth of a second crystal at the same stable level of melt. This limits the amount of nonproductive time furnace components including crucibles are exposed to heat. The effective lifetime of the components is extended and productivity is greatly increased.

Both loading chambers used in this "continuous" process function as pulling chambers, which include lifting and rotating mechanisms for pulling crystals from the melt. Accordingly, the two lift chambers can be made identically and interchanged in any order. However, one of the chambers could also be further modified to transfer charges to the furnace for practicing a "recharging" process.

DRAWINGS

FIGS. 6A–6C are schematic illustrations of the new crystal-growing machine involved at various stages of a "recharging" process.

FIG. 7 is a view of one of the loading chambers modified to receive a recharging device for adding granular or chunk crystal-forming material to the furnace chamber.

DETAILED DESCRIPTION

Figure 2:
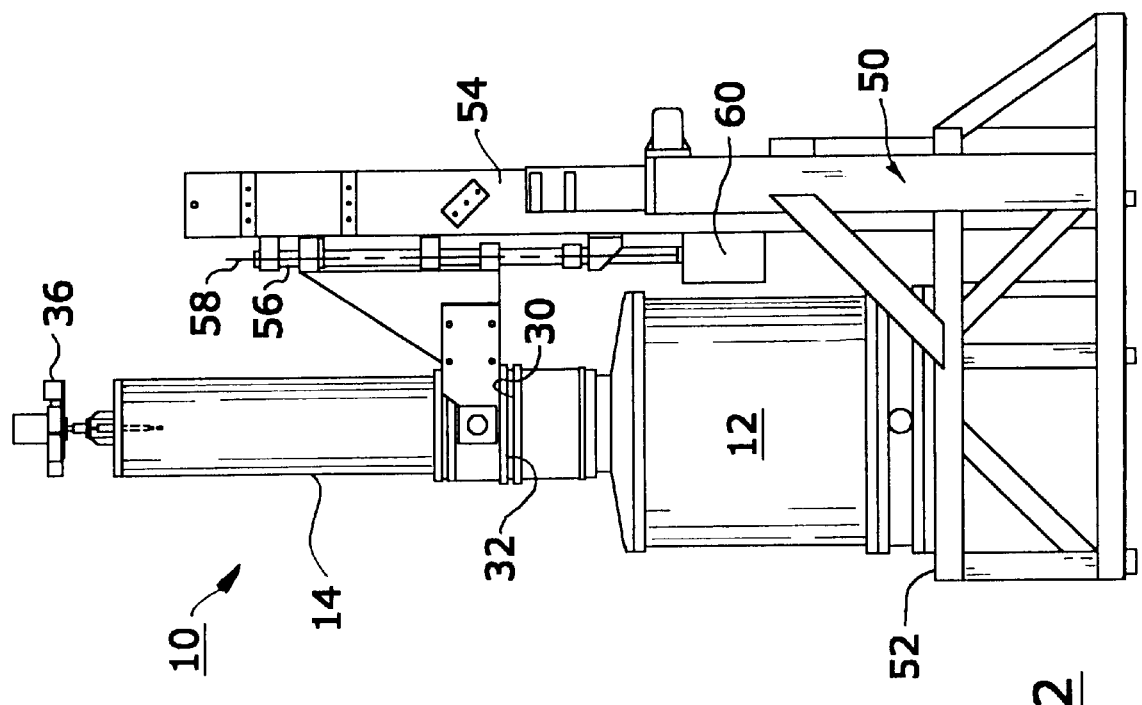
FIG. 2 is a side elevational view of the same machine.
Figure 1:
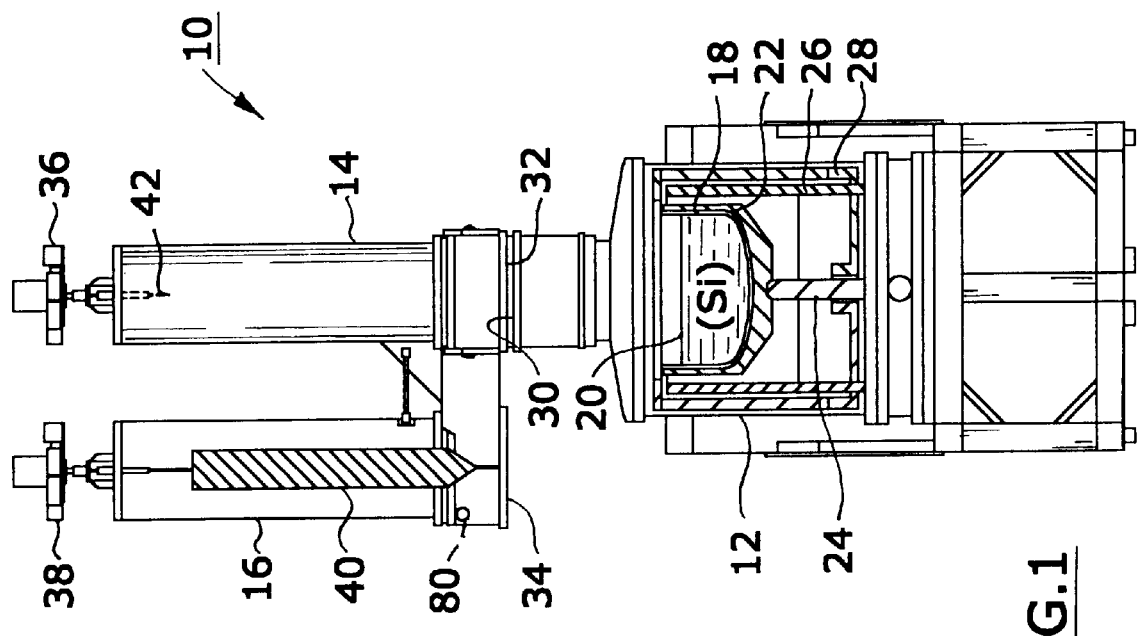
FIG. 1 is a front elevational view of my new crystal-growing machine with a portion of a furnace chamber cut away to show furnace components.

One embodiment of my invention as a new crystal-growing machine 10 can be seen in the first three drawing figures. The machine 10 includes a vacuum furnace chamber 12 and two vacuum loading chambers 14 and 16. At least one of the loading chambers 14 and 16 can also be referred to as a "pulling" chamber. However, the term "loading" is used in a broader sense, contemplating any exchange of crystal materials into or out of the furnace chamber 12.

Within the vacuum furnace chamber 12 are the usual furnace components including a silica crucible 18 containing a melt 20 of crystal-forming material such as silicon, germanium, or gallium arsenic. The silica crucible 18 is supported in a graphite shell 22 that is mounted for rotation and vertical translation on a shaft 24. A graphite resistance heater 26 surrounds the crucible 18 and graphite shell 22 for melting the crystal-forming material. A thermal shield 28, which can also be made of graphite, protects walls of the furnace chamber 12 from extreme heat generated by the heater 26.

The two vacuum loading chambers 14 and 16, which together can be referred to as a multi-chamber loader, include respective openings 32 and 34 that are alternately engageable with a mating opening 30 in the furnace chamber 12 for maintaining common vacuum pressures between the furnace chamber 12 and either of the loading chambers 14 and 16. In this embodiment, both loading chambers 14 and 16 also include respective lifting mechanisms 36 and 38 for raising (pulling) a crystal 40 from the melt through the opening 30 in the furnace chamber 12 or for lowering a new seed crystal 42 from one of the loading chambers 14 and 16 into the melt 20. The lifting mechanisms 36 and 38 can also be used to suspend the crystal 40 within the loading chambers 14 and 16 for cooling or to discharge the crystal 40 from the loading chambers 14 and 16 through their respective openings 32 and 34.

A frame 50 resting on a subfloor includes a base 52 for supporting the furnace chamber 12 and a column 54 for supporting the loading chambers 14 and 16. A pintle 56 secured to the column 54 supports the loading chambers for both angular movement around axis 58 and vertical movement along the axis 58. In this embodiment, a single drive mechanism 60 pivots and translates both of the loading chambers 14 and 16 together. However, separate drives could be used to move the loading chambers 14 and 16 independently.

Figure 4:
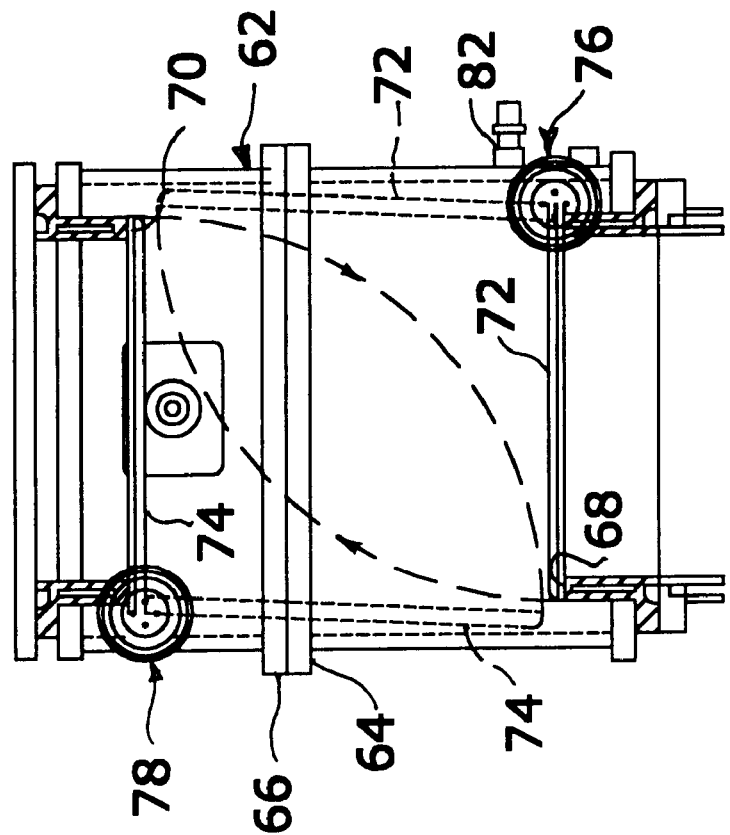
FIG. 4 is an enlarged cross-sectional view of a coupling chamber between the furnace chamber and one of the loading chambers showing flapper valves in open and closed positions.
Figure 3:
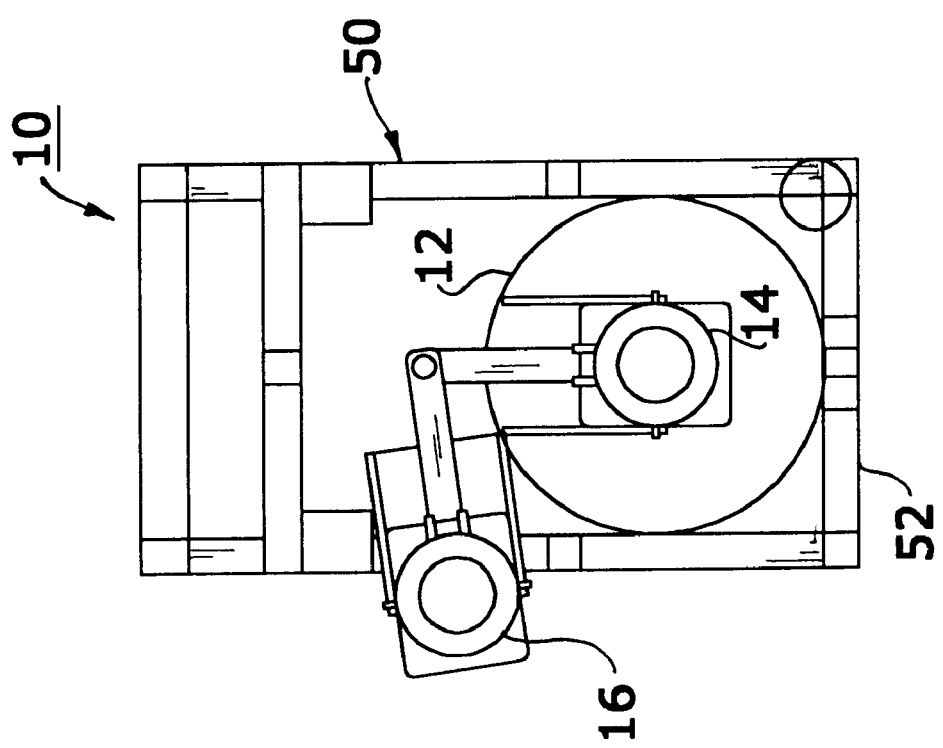
FIG. 3 is a top view of the machine showing relative angular positions of two loading chambers.

An enlarged view of a coupling chamber 62 between the furnace chamber 12 and the loading chamber 14 is shown in FIG. 4. In the middle of the coupling chamber 62, the opening 30 of the furnace chamber 12 and the opening 32 of the loading chamber 14 are surrounded and sealed by respective flanges 64 and 66. Recessed within each of the openings 30 and 32 are valve seats 68 and 70 that define the ends of the coupling chamber 62. Respective flappers 72 and 74 of shutoff valves 76 and 78 are pivotable between open and closed positions against the valve seats 68 and 70 through a common space within the coupling chamber 62. The shutoff valves 76 and 78 must be operated sequentially to avoid collisions between their respective flappers 72 and 74. However, the use of a common space for operating the valves 76 and 78 limits the height of the coupling chamber 62 as well as the overall height of the machine 10.

The two shutoff valves 76 and 78 can be opened to maintain a common vacuum pressure between the furnace chamber 12 and the loading chamber 14, or the valves 76 and 78 can be closed to maintain separate vacuum pressures within the two chambers 12 and 14. For example, the valves 76 and 78 can be closed prior to disengaging the respective openings 30 and 32 to isolate both the furnace chamber 12 and the loading chamber 14 from ambient air surrounding the machine 10.

A similar shutoff valve 80 is mounted in the opening 34 of the loading chamber 16 for isolating contents of the loading chamber 16 from the ambient environment. The drive mechanism 60 pivots the two loading chambers 14 and 16 between the illustrated position at which the opening 32 in the loading chamber 14 is engaged with the opening 30 in the furnace chamber 12 and a different position at which the opening 34 in the loading chamber 16 is engaged with the opening 30 in the furnace chamber 12. Between engagements, the shutoff valves 76, 78, and 80 preserve separate vacuum environments in the furnace chamber 12 and the two loading chambers 14 and 16.

A vacuum port 82 is used for controlling pressure within the coupling chamber 62 to avoid pressure differences between adjacent chambers 12 and 14 or 16 that could affect operation of the shutoff valves 76 and 78 or 80. The vacuum port 82 is located in a portion of the coupling chamber 62 within the opening 30 of the furnace chamber 12. However, similar vacuum ports could also be located in alternate portions of the coupling chamber within either of the respective openings 32 and 34 of the loading chambers 14 and 16.

Figure 5:
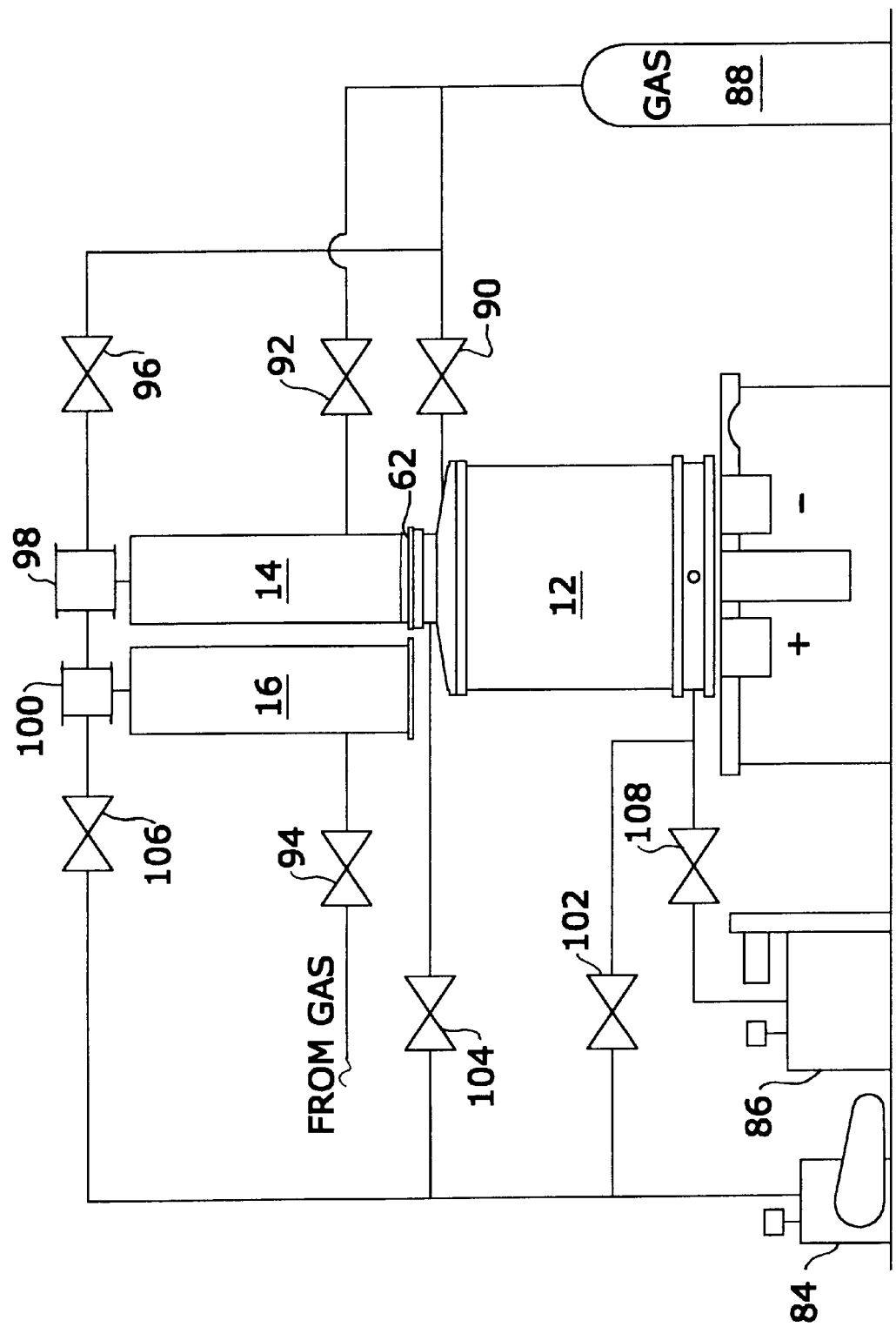
FIG. 5 is a diagram of a vacuum and gas circulation system for servicing the new machine.

FIG. 5 illustrates a combined vacuum and gas circulation system for the furnace chamber 12 and the two loading chambers 14 and 16. The system includes two vacuum pumps 84 and 86 and a supply of pressurized gas 88 such as argon or nitrogen. A valve 90 controls the flow of gas to the furnace chamber 12 and valves 92, 94, and 96 control the flow of gas to the two loading chambers 14 and 16. Respective manifolds 98 and 100 control flows of gas into and out of the loading chambers 14 and 16.

The vacuum pump 84 is connected to the furnace chamber 12 through valve 102, to the coupling chamber 62 through valve 104, and to the manifolds 98 and 100 of the loading chambers 14 and 16 through valve 106. The arrangement provides for separately controlling amounts of vacuum pressure in the furnace chamber 12, each of the two loading chambers 14 and 16, and the coupling chamber 62. The vacuum pump 86 is connected to the furnace chamber 12 through valve 108.

The two pumps operate in different pressure ranges. For example, the vacuum pump 84 operates in a range of vacuum pressures from atmosphere to approximately 20 torr, and the vacuum pump 86 operates in the presence of the flow of gas to pressures below 20 torr. Thus, the pump 84 is generally used for pumpdown operations, and the pump 86 is used for the remaining vacuum processing operations including meltdown and crystal growth. However, the pump 84 could also be used to periodically purge gas from one of the closed loading chambers 14 and 16 such as while cooling a crystal.

Figure 6A:
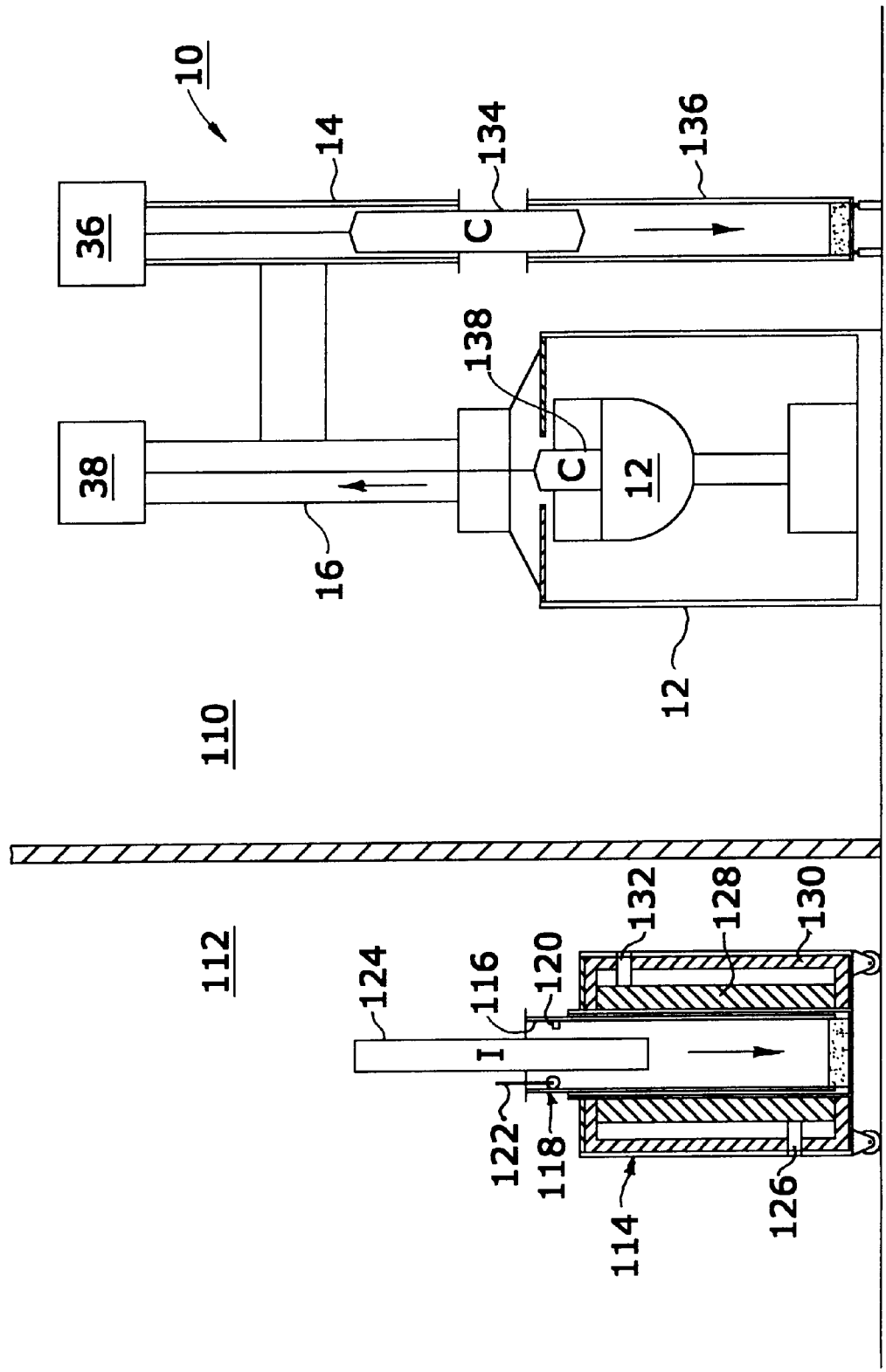

FIGS. 6A, 6B, and 6C depict the new crystal-growing machine 10 in a more schematic format involved in three stages of a "recharging" process. FIG. 6A shows simultaneous activities in two different clean rooms 110 and 112. The clean room 110 contains the crystal-growing machine 10; and the clean room 112, which is preferably smaller, is used for transferring a charge of crystal-forming material to a vacuum transport chamber 114.

The vacuum transport chamber 114 includes an opening 116 containing a shutoff valve 118. Similar to the shutoff valve 76 in the furnace chamber opening 30, the shutoff valve 118 includes a valve seat 120 and a flapper 122 that can be opened or closed against the seat 120 to maintain vacuum pressure within the vacuum transport chamber 114. The charge can take the form of granules or chunks but is preferably in the form of one or more ingots 124. Once the ingots 124 are loaded into the vacuum transport chamber 114, the shutoff valve 118 is closed and the transport chamber 114 is evacuated through an output port 126.

The vacuum transport chamber 114 can also include a graphite resistance heater 128 surrounded by a graphite shield 130. The heater 128 preheats the ingots 124 within an evacuated environment. For example, the ingots 124 can be preheated to 800° Centigrade or higher (e.g., 1000° C.) to better prepare the ingots 124 for recharging the melt 20. Associated impurities within the evacuated environment are removed by circulation of an inert gas such as argon or nitrogen from an input port 132 to the output port 126.

Meanwhile, in the larger clean room 110, a first crystal 134 is lowered into a second transport chamber 136 from the loading chamber 14, and a second crystal 138 is grown from the melt 20 in the furnace chamber 12 and pulled into the loading chamber 16. The first crystal 134 is assumed to be sufficiently cooled to permit exposure to ambient air within the larger clean room 110 while being lowered into the second transport chamber 136. However, if the first crystal 134 is still hot, then the transfer must take place in an evacuated environment.

For example, the second transport chamber 136 could be formed similar to one of the loading chambers 14 and 16 with a mating opening, a flapper-action shutoff valve, and vacuum porting to maintain both a common and a separate vacuum environment with either of the loading chambers 14 and 16. The hot crystal 134 would be transferred from the loading chamber 14 to the modified second transport chamber within the common vacuum environment and cooled within the separate vacuum environment of the modified transport chamber. This frees the loading chamber 14 for other uses.

In FIG. 6B, the first transport chamber 114 arrives in the larger clean room 110 with the preheated ingots 124. While the second crystal 138 continues to grow, the loading chamber 14 is evacuated and lowered into engagement with the first transport chamber 114. Alternatively, the first transport chamber 114 could be raised into engagement with the loading chamber 14. During the engagement, the openings 32 and 116 of the two chambers 14 and 114 are sealed together, and their respective valves 78 and 118 are opened forming a common vacuum environment between the chambers 14 and 114. The lifting mechanism 36 raises the preheated ingots 124 into the loading chamber 14. Then, the shutoff valve 78 is closed to maintain the heated ingots 124 in an evacuated environment until the second crystal 138 is completely grown. Gas circulation can be maintained if needed.

After the second crystal 138 is completely grown, the shutoff valves 76 and 80 of the furnace chamber 12 and the loading chamber 16 are closed for maintaining separate evacuated environments within the chambers. The drive mechanism 60 (shown in FIG. 2) rotates the loading chamber 16 out of engagement with the furnace chamber 12 and rotates the loading chamber 14 back into engagement with the furnace chamber.

The new positions of the two loading chambers 14 and 16 are shown in FIG. 6C. After purging the coupling chamber 62, the valves 76 and 78 are reopened. The lifting mechanism 36 lowers the heated ingots 124 into the furnace chamber 12 for replenishing the melt 20. Throughout this exemplary meltdown cycle, the second crystal 138 is cooled within the sealed vacuum environment of the loading chamber 16.

The preheating of the ingots 124 before being lowered into the furnace chamber 12 greatly reduces thermal gradients along the length of the ingots 124 and their accompanying thermal stresses. This permits the use of less expensive materials such as Trichlorsilon ingots ($SiHCl_3$), which would otherwise be subject to breakage from the extreme temperature conditions. For example, preheating ingots of $SiHCl_3$ to 1000° C. reduces the temperature difference over the length of the ingots to only around 400° C. Preheating improves purity and also shortens the time required to completely recharge the melt 20.

An alternative device 140 for recharging the melt 20 during the meltdown cycle is shown in FIG. 7. The recharging device 140 is mounted in the loading chamber 14 in place of the lifting mechanism 36 for dispensing granules or chunks 142 of crystal-forming material instead of the ingots 124. An adjustable size opening 144 is located close to the melt 20 so that the granules or chunks are also melted. A variety of other devices including those used in continuous processes could also be mounted in the loading chamber for recharging the melt.

Figure 8A:
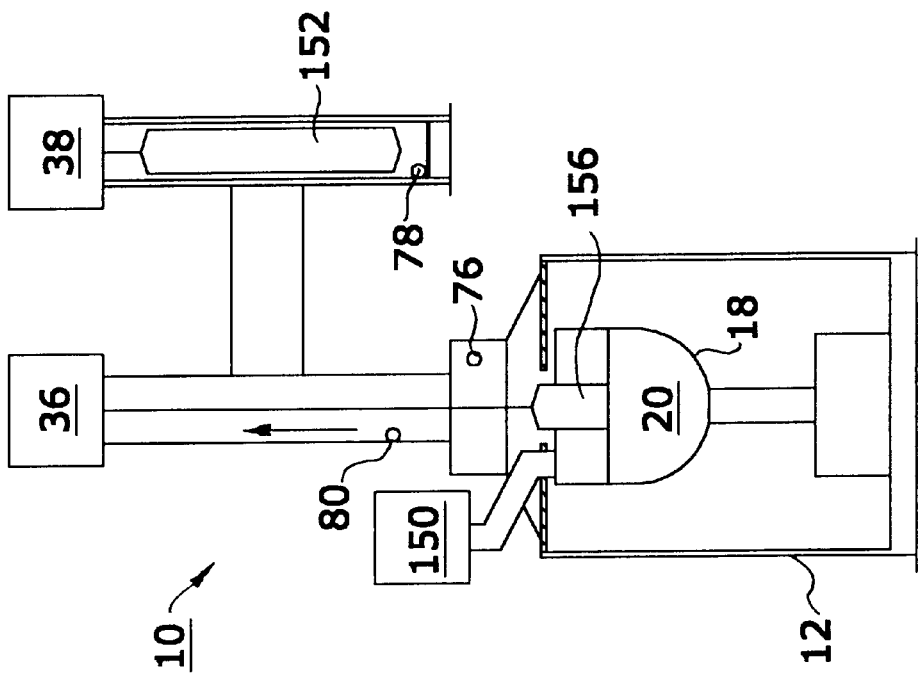
FIGS. 8A and 8B are schematic illustrations of two stages of a "continuous" process.
Figure 8B:
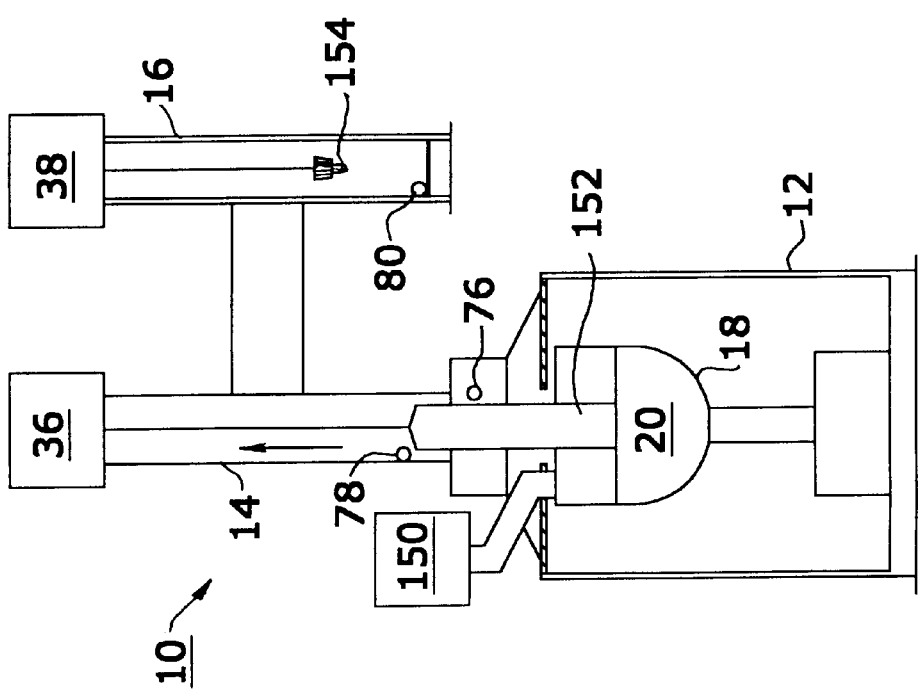

FIGS. 8A and 8B show two stages of an exemplary "continuous" process. For practice of this method, the machine 10 is equipped with a recharging device 150 for replenishing crystal-forming material to the melt 20 during crystal growth. Such devices are available for feeding crystal-forming material in solid or liquid form, including granules, chunks, and ingots.

In FIG. 8A, the lifting mechanism 36 of loading chamber 14 pulls a first crystal 152 from melt 20, which is maintained at a constant level within the crucible 18 by the recharging device 150. A seed crystal 154 is suspended by the lifting mechanism 38 in other loading chamber 16. In contrast to prior "continuous" processes, which are interrupted for cleaning and replacing furnace components, the recharging device 150 of my invention can be used to maintain a constant melt level throughout the entire length of crystal growth. Accordingly, at the completion of the growth of the first crystal 152, the melt is ready for starting growth of a second crystal 156 as shown in FIG. 8B.

To engage the loading chamber 16 with the furnace chamber 12 in place of the loading chamber 14, the shutoff valves 76 and 78 are closed to isolate both the furnace chamber 12 and the loading chamber 14 from ambient conditions. The loading chamber 14 containing the first crystal 152 is rotated out of engagement with the furnace chamber 12 and the loading chamber 16 containing the seed crystal 154 is rotated into engagement with the loading chamber 12. Preferably, the loading chamber 16 is already evacuated so only the small volume of the coupling chamber must be evacuated to reopen the valves 76 and 80 and establish a common vacuum environment between the furnace chamber 12 and loading chamber 16. Thereafter, the seed crystal 154 is dipped into the melt 20 and the second crystal 156 is withdrawn from the melt 20.

The melt 20 can also be continuously replenished during the growth of the second crystal 156. After the first crystal 152 has sufficiently cooled, the first crystal is discharged from the loading chamber 14 and a new seed crystal (not shown) is mounted in its place. Earlier discharge of the first crystal 152 would be possible by transferring the first crystal 152 into another vacuum chamber such as the suggested modified transport chamber. The process can be continued without interruption until the lifetime of one or more of the furnace components has been exhausted.

Figure 9:
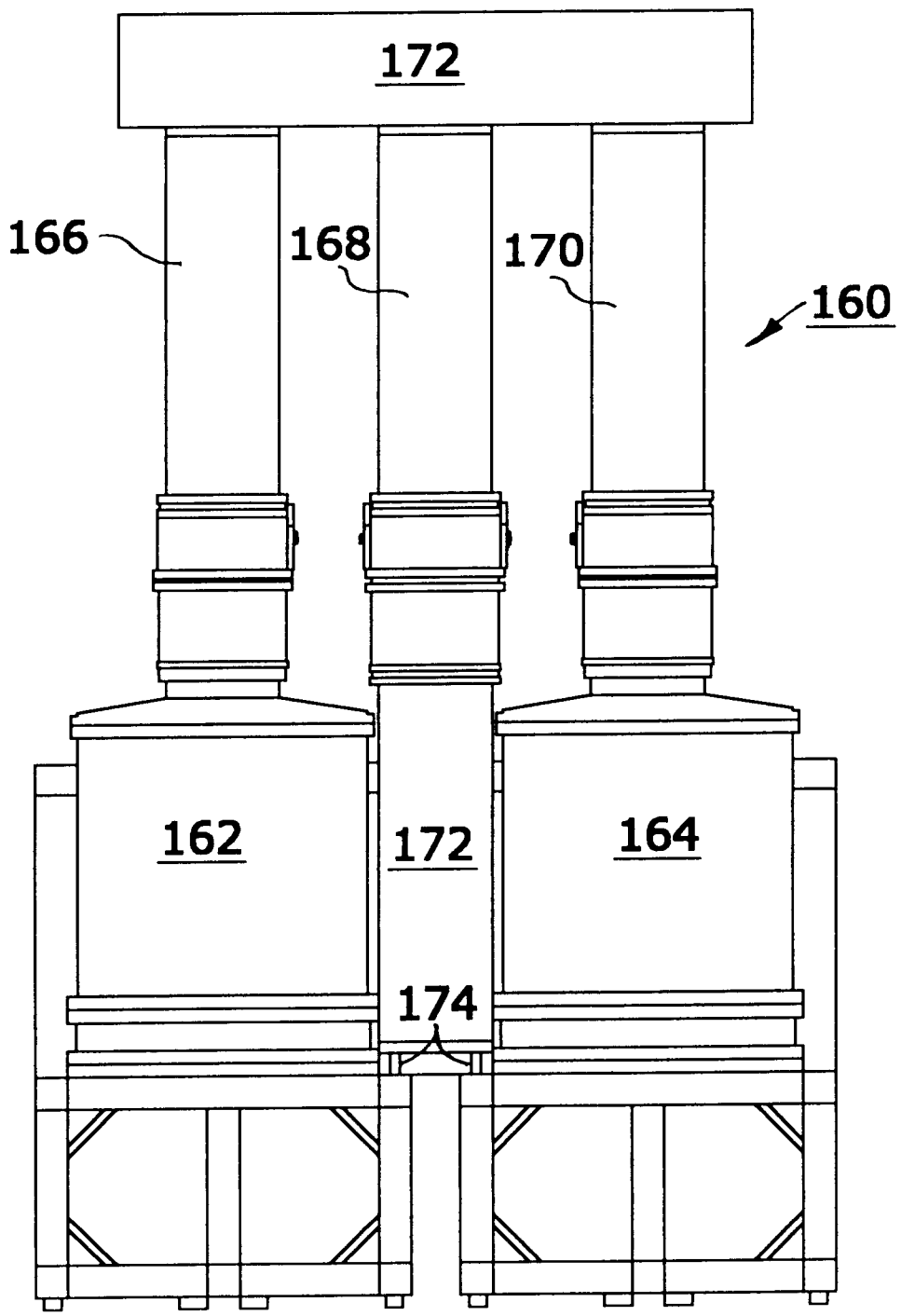
FIG. 9 is a front elevational view of my invention arranged as a cluster tool for simultaneously growing a plurality of crystals.

FIG. 9 shows my invention arranged as an exemplary cluster tool 160, which includes two furnace chambers 162 and 164 and three loading chambers 166, 168, and 170. An overhead lift assembly 172 provides for moving at least the loading chamber 168 between its illustrated position and two alternate positions of engagement with the furnace chambers 162 and 164. The loading chambers 166 and 170 can be moved into and out of engagement with their respective furnace chambers 162 and 164 by a separate positioning mechanism similar to the crystal-growing machine 10 or by an independent positioning mechanism such as the overhead lift assembly 172. In the latter case, all three loading chambers 166, 168, and 170 can be moved into engagement with either furnace chamber 162 and 164.

The loading chamber 168 is engaged with a vacuum transport chamber 172 for transferring crystal materials between chambers. For example, crystal-forming materials can be transferred in a vacuum environment from the transport chamber 172 to the loading chamber 168, or a finished crystal can be transferred in a similar environment from the loading chamber 168 to the transport chamber 172. The loading chamber 168 could also be equipped with a recharging device similar to that shown in FIG. 7 for transferring a charge of crystal-forming material to one of the two furnace chambers 162 and 164. For "continuous" operations, all three loading chambers 166, 168, and 170 could be equipped with lifting mechanisms similar to the lifting mechanisms 36 and 38 of machine 10.

All of the chambers 162, 164, 166, 168, 170, and 172 include openings and shutoff valves similar to the above-described machine 10 for maintaining separate vacuum environments. Except for the wheels 174, the transport chamber 172 is otherwise similar to the loading chambers 166, 168, and 170. In fact, by making appropriate adjustments for the inversion, it would be possible to use a similar chamber as both a transport chamber and loading chamber, particularly if the loading chamber is only used to recharge the melt.

More furnace chambers can be used in combination with preferably at least one additional loading chamber to improve productivity of each of the furnace chambers. For example, four furnace chambers could be used in combination with five loading chambers. The additional loading chamber could be used to service all of the furnace chambers or the individual loading chambers can be exchanged between the multiple furnace chambers.

I claim:

1. A crystal-growing machine comprising:
   a vacuum furnace chamber for containing a melt of crystal-forming material;
   an opening in said furnace chamber for pulling a crystal from the melt;
   first and second vacuum loading chambers;
   each of said first and second vacuum loading chambers having an opening that is alternately engageable with said opening in the furnace chamber for maintaining a common vacuum pressure between said furnace chamber and either of said first and second vacuum loading chambers; and
   a positioning mechanism that moves said first and second vacuum loading chambers between a first position at which said opening in the first vacuum loading chamber is engaged with said opening in the furnace chamber and a second position at which said opening in the second vacuum loading chamber is engaged with said opening in the furnace chamber.

2. The machine of claim 1 in which said first vacuum loading chamber includes a lifting mechanism for pulling the crystal from the melt into said first vacuum loading chamber.

3. The machine of claim 2 in which said second vacuum loading chamber also includes a lifting mechanism for pulling another crystal from the melt into said second vacuum loading chamber.

4. The machine of claim 2 in which said second vacuum loading chamber includes a recharging device for adding more crystal-forming material to the melt.

5. The machine of claim 1 further comprising a support for pivotally mounting said first and second vacuum loading chambers for angular movement between the first and second positions.

6. The machine of claim 5 in which said first and second vacuum loading chambers are mounted in a relatively fixed angular orientation and are pivotable together by a common drive mechanism.

7. The machine of claim 1 further comprising a first valve for closing said opening in the first vacuum loading chamber and a second valve for closing said opening in the second vacuum loading chamber for maintaining vacuum pressures independently of said vacuum furnace chamber.

8. The machine of claim 7 further comprising a third valve for closing said opening in the vacuum furnace chamber for maintaining a vacuum pressure independently of said first and second vacuum loading chambers.

9. The machine of claim 8 in which said vacuum furnace chamber and said first and second vacuum loading chambers are separately connected to a source of vacuum pressure.

10. The machine of claim 9 further comprising a coupling chamber for engaging said opening in the vacuum furnace chamber with the respective openings in the vacuum loading chambers.

11. The machine of claim 10 in which said coupling chamber is separately connected to the source of vacuum pressure.

12. The machine of claim 11 in which said first, second, and third valves are flapper valves and said first and third flapper valves and said second and third flapper valves have respective flappers that move between open and closed positions through a common space in the coupling chamber.

13. A multi-chamber loader for a crystal-growing machine of a type including a vacuum furnace chamber for melting crystal-forming material comprising:
    a support;
    first and second vacuum loading chambers mounted from the support;
    each of said first and second vacuum loading chambers having an open end and a valve for closing said open end to maintain vacuum pressure within said vacuum loading chambers;
    said first vacuum loading chamber including a lifting mechanism for pulling a crystal from the vacuum furnace chamber through said open end of the first vacuum loading chamber; and
    a positioning mechanism for relatively moving said first and second vacuum loading chambers between respective positions in engagement with the vacuum furnace chamber.

14. The multi-chamber loader of claim 13 further comprising a transport chamber for maintaining a charge of crystal-forming material in an evacuated environment.

15. The multi-chamber loader of claim 14 in which said transport chamber includes an open end and a valve for closing said open end of the transport chamber to maintain vacuum pressure within said transport chamber.

16. The multi-chamber loader of claim 15 in which said transport chamber is movable independently of said first and second vacuum chambers.

17. The multi-chamber loader of claim 16 in which said opening in the second vacuum chamber is alternately engageable with (a) said opening in the transport chamber for receiving the charge of crystal-forming material and (b) an opening in the furnace chamber for transferring the charge of crystal-forming material to the furnace chamber.

18. The multi-chamber loader of claim 13 in which said second vacuum loading chamber also includes a lifting mechanism for pulling a crystal from the vacuum furnace chamber through said open end of the second vacuum loading chamber.

19. The multi-chamber loader of claim 18 further comprising a separate device for adding crystal-forming material to the furnace chamber at the same time that a crystal is being lifted into one of said loading chambers.

20. The multi-chamber loader of claim 13 in which said first and second vacuum loading chambers are pivotable together between the respective positions of engagement with the vacuum furnace chamber.

21. A system for supplying a crystal-growing machine comprising:
    a preheating chamber for preheating crystal-forming material in a solid state;
        an opening in said preheating chamber for removing the preheated crystal-forming material;
    a furnace chamber for melting the preheated crystal-forming material;
        an opening in said furnace chamber for receiving the preheated crystal-forming material;
    a loading chamber for receiving the preheated crystal-forming material from the preheating chamber and for depositing the preheated crystal-forming material in the furnace chamber;
        an opening in said loading chamber being alternately engageable with (a) said opening in said preheating furnace chamber for maintaining a common vacuum pressure between said preheating chamber and said loading chamber and (b) said opening in said furnace chamber for maintaining a common vacuum pressure between said furnace chamber and said loading chamber; and
    a positioning mechanism that moves said loading chamber between (a) a first position at which said opening in the loading chamber is engaged with said opening in the preheating chamber for receiving the preheated crystal-forming material from the preheating chamber and (b) a second position at which said opening in the loading chamber is engaged with said opening in the furnace chamber for depositing the preheated crystal-forming material in the furnace chamber.

22. The system of claim 21 in which said opening in the furnace is arranged for pulling a crystal from the melted crystal-forming material.

23. The system of claim 21 in which said opening in the furnace is engageable with said opening in the loading chamber for pulling the crystal into the loading chamber.

24. The system of claim 23 in which said loading chamber includes a lifting and rotating mechanism for pulling the crystal into the loading chamber.

25. The system of claim 21 further comprising a first shutoff valve for closing said opening in the loading chamber for maintaining a separate vacuum pressure within the loading chamber between engagements with said openings in the preheating chamber and the furnace.

26. The system of claim 25 further comprising third and fourth shutoff valves for closing said openings in the preheating chamber and the furnace chamber for maintaining separate vacuum pressures between engagements with said opening in the loading chamber.

27. A system for handling crystal materials of a crystal-growing machine comprising:
    a loading chamber mounted from a support and having an opening and a valve within said opening;
        said opening in the loading chamber being shaped for engaging an opening in a furnace chamber for maintaining a common vacuum environment within which the crystal material can be transferred between the engaged chambers;
        said valve in the loading chamber providing for closing said opening in the loading chamber to maintain a separate vacuum pressure within said loading chamber;
    a transport chamber also having an opening and a valve within said opening in the transport chamber;
        said opening in the transport chamber being shaped for engaging said opening in the loading chamber for maintaining a common vacuum environment within which the crystal material can be transferred between the engaged chambers; and
        said valve in the transport chamber providing for closing said opening in the transport chamber to maintain a separate vacuum pressure within said transport chamber.

28. The system of claim 27 further comprising a positioning mechanism that moves said loading chamber between (a) a first position at which said opening in the loading chamber is engaged with the opening in the furnace chamber for receiving a crystal from the furnace chamber and (b) a second position at which said opening in the loading chamber is engaged with said opening in the transport chamber for transferring the crystal to said transport chamber.

29. The system of claim 28 in which said loading chamber includes a lifting mechanism for pulling the crystal from the furnace chamber into the loading chamber.

30. The system of claim 27 in which said valves of the loading chamber and the transport chamber are flapper-action valves having flappers movable between open and closed positions within the same space.

31. The system of claim 27 in which said transport chamber includes a vacuum port for reducing pressures within said transport chamber.

32. A cluster tool for simultaneously making a plurality of crystals comprising:
    a first furnace chamber for melting crystal-forming material;
    a first loading chamber engageable with said first furnace chamber for maintaining a common vacuum pressure with said first furnace chamber;
    a first lifting mechanism for pulling a first crystal from said first furnace chamber into said first loading chamber;
    a second furnace chamber for melting crystal-forming material;
    a second loading chamber engageable with said second furnace chamber for maintaining a common vacuum pressure with said second furnace chamber;
    a second lifting mechanism for pulling a second crystal from said second furnace chamber into said second loading chamber;
    a third loading chamber alternately engageable with (a) said first furnace chamber for maintaining a common vacuum pressure with said first furnace chamber and (b) said second furnace chamber for maintaining a common vacuum pressure with said second furnace chamber; and
    a positioning device that moves said third loading chamber between positions of engagement with said first and second furnace chambers.

33. The cluster tool of claim 32 in which said positioning device (a) relatively moves said first and third loading chambers between positions of engagement with said first furnace chamber and (b) relatively moves said second and third loading chambers between positions of engagement with said first furnace chamber.

34. The cluster tool of claim 33 further comprising a recharging device mounted in said third loading chamber for transferring a charge of crystal-forming material to one of said first and second furnace chambers.

35. The cluster tool of claim 33 further comprising a third lifting mechanism for pulling a third crystal from one of said first and second furnace chambers.

36. The cluster tool of claim 35 further comprising first and second -devices for adding crystal-forming material to the first and second furnace chambers at the same times that the first and second crystals are being lifted into said first and second loading chambers.

37. The cluster tool of claim 32 further comprising third and fourth furnace chambers for melting crystal-forming material, fourth and fifth loading chambers engageable with said third and fourth furnace chambers for maintaining common vacuum pressures, and third and fourth lifting mechanisms for pulling third and fourth crystals from said third and fourth furnace chambers into said fourth and fifth loading chambers.

38. The cluster tool of claim 32 in which said positioning device is an overhead lift that independently moves each of said loading chambers into and out of engagement with either of said first and second furnace chambers.

* * * * *